(12) United States Patent
Nakayama et al.

(10) Patent No.: US 8,770,724 B2
(45) Date of Patent: Jul. 8, 2014

(54) PIEZOELECTRIC ELEMENT, LIQUID EJECTING HEAD, AND LIQUID EJECTING APPARATUS

(75) Inventors: Masao Nakayama, Nagano (JP); Noboru Furuya, Nagano (JP)

(73) Assignee: Seiko Epson Corporation

( * ) Notice: Subject to any disclaimer, the term of this patent is extended or adjusted under 35 U.S.C. 154(b) by 21 days.

(21) Appl. No.: 13/420,288

(22) Filed: Mar. 14, 2012

(65) Prior Publication Data
US 2012/0236081 A1    Sep. 20, 2012

(30) Foreign Application Priority Data

Mar. 15, 2011    (JP) ................................. 2011-056276

(51) Int. Cl.
*B41J 2/045*    (2006.01)
(52) U.S. Cl.
USPC .................................. 347/68; 347/70; 347/71
(58) Field of Classification Search
USPC .............................................. 347/68, 70, 71
See application file for complete search history.

(56) References Cited

U.S. PATENT DOCUMENTS

| | | | | |
|---|---|---|---|---|
| 7,274,134 | B2 * | 9/2007 | Ohmori et al. | 310/366 |
| 7,364,275 | B2 * | 4/2008 | Lim et al. | 347/70 |
| 8,189,296 | B2 * | 5/2012 | Hata et al. | 360/245.3 |
| 2009/0244206 | A1 * | 10/2009 | Nakayama | 347/68 |
| 2010/0231657 | A1 * | 9/2010 | Takahashi | 347/68 |

FOREIGN PATENT DOCUMENTS

JP    2005-178293    7/2005

* cited by examiner

*Primary Examiner* — Henok Legesse
(74) *Attorney, Agent, or Firm* — Workman Nydegger

(57) ABSTRACT

A piezoelectric element including: a first electrode, a piezoelectric layer formed above the first electrode to have a longitudinal direction and a transverse direction, and a second electrode formed above the piezoelectric layer, wherein at least a part of a side surface of the piezoelectric layer in the transverse direction is a concavo-convex surface, and a width of the piezoelectric layer in the transverse direction from the second electrode to the first electrode changes with the concavo-convex surface.

8 Claims, 16 Drawing Sheets

PIEZOELECTRIC ELEMENT, LIQUID EJECTING HEAD, AND LIQUID EJECTING APPARATUS

This application claims a priority to Japanese Patent Application No. 2011-056276 filed on Mar. 15, 2011 which is hereby expressly incorporated by reference herein in its entirety.

BACKGROUND

1. Technical Field

The present invention relates to a piezoelectric element, a liquid ejecting head, and a liquid ejecting apparatus.

2. Related Art

The piezoelectric element is an element having a characteristic of changing its shape according to the application of voltage and has a structure interposing a piezoelectric layer between an upper electrode and a lower electrode. Piezoelectric elements are used in a variety of applications, for example, liquid ejecting head portions of ink jet printers, various actuators, and the like.

For example, JP-A-2005-178293 discloses a piezoelectric element having a form in which the lower electrode is set as a common electrode and the upper electrode is set as a separate electrode.

Regarding piezoelectric elements, there are cases where moisture or the like sticks to a side surface of a piezoelectric layer, such as during manufacturing or driving thereof, whereby the side surface of the piezoelectric layer sometimes becomes a leakage path between the upper electrode and the lower electrode. When leakage current is generated between the upper and lower electrodes, the piezoelectric layer is burned and the reliability of the piezoelectric element may be deteriorated.

SUMMARY

An advantage of some aspects of the invention is that a reliable piezoelectric element is provided. In addition, an advantage of some aspects of the invention is that a liquid ejecting head including a piezoelectric element, and a liquid ejecting apparatus are provided.

According to a first aspect of the invention, there is provided a piezoelectric element including: a first electrode; a piezoelectric layer formed above the first electrode to have a longitudinal direction and transverse direction; and a second electrode formed above the piezoelectric layer, in which at least a part of the surface side of the piezoelectric layer in the transverse direction is a concavo-convex surface, and a width of the piezoelectric layer in the transverse direction from the second electrode to the first electrode changes with the concavo-convex surface.

According to such a piezoelectric element, for example, in comparison to a case where the side surface of the piezoelectric layer is a flat surface, it is possible to increase the side surface length (length along the side surface between the electrodes) between the first electrode and the second electrode. Accordingly, it is possible to reduce the leakage current between the electrodes, passing through the side surface of the piezoelectric layer. Thus, such piezoelectric elements may have high reliability.

In addition, according to the aspect of the invention, the phrase "above" is used as "above a specific thing (hereafter referred to as "A"), another specific thing (hereafter referred to as "B") is formed", for example. According to the aspect of the invention, in the case of such an example, the phrase "above" is used with a meaning including cases where B is formed directly on A and cases where B is formed on A with another thing interposed therebetween.

In the piezoelectric element, the piezoelectric layer and the first electrode may intersect with each other, and the side surface of the piezoelectric layer in the transverse direction may be a flat surface at the point of intersection with the outer circumference of the first electrode.

According to such a piezoelectric element, in a portion which is a boundary of an active part and an inactive part and in which stress is easily concentrated, it is possible to suppress displacement and to suppress the generation of cracks or the like caused by stress concentration.

In the piezoelectric element, the width of the second electrode in the transverse direction may be smaller than a minimum width of the piezoelectric layer in the transverse direction.

According to such a piezoelectric element, it is possible to determine the size of the active part of the piezoelectric layer by the size of the second electrode.

In the piezoelectric element, the side surface of the second electrode in the transverse direction may be connected to the side surface of the piezoelectric layer in the transverse direction.

According to such a piezoelectric element, it is possible to more reliably protect the interface between the piezoelectric layer and the second electrode when a coating layer is formed.

In the piezoelectric element, the side surface of the piezoelectric element in the transverse direction may be covered with a coating layer and Young's modulus of the coating layer may be smaller than Young's modulus of the piezoelectric layer.

According to such a piezoelectric element, even if the coating layer is formed on the side surface of the piezoelectric layer, it is possible to suppress the deterioration of the displacement amount of the piezoelectric layer.

In the piezoelectric element, the side surface of the piezoelectric layer in the transverse direction may have a flat surface connected to the upper surface of the piezoelectric layer, the concavo-convex surface may be connected to the flat surface, the side surface of the flat surface and the second electrode may be covered by the first coating layer, the concavo-convex surface may be covered by the second coating layer, and Young's modulus of the second coating layer may be smaller than Young's modulus of the first coating layer and Young's modulus of the piezoelectric layer.

According to such a piezoelectric element, while preventing moisture or the like from entering the interface between the piezoelectric layer and the second electrode, it is possible to suppress the deterioration of the displacement amount of the piezoelectric layer.

In the piezoelectric element, the material of the first coating layer may be aluminum oxide and the material of the second coating layer may be a polyimide.

According to such a piezoelectric element, while preventing moisture or the like from entering the interface between the piezoelectric layer and the second electrode, it is possible to suppress the deterioration of the displacement amount of the piezoelectric layer.

According to a second aspect of the invention, the liquid ejecting head includes the piezoelectric element according to the first aspect of the invention.

According to such a liquid ejecting head, since the piezoelectric element according to the first aspect of the invention is included, it is possible to obtain high reliability.

According to a third aspect of the invention, the liquid ejecting apparatus includes the liquid ejecting head according to the second aspect of the invention.

According to such a liquid ejecting apparatus, since the liquid ejecting head according to the second aspect of the invention is included, it is possible to obtain high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described with reference to the drawings.

1. Piezoelectric Element

Figure 1:
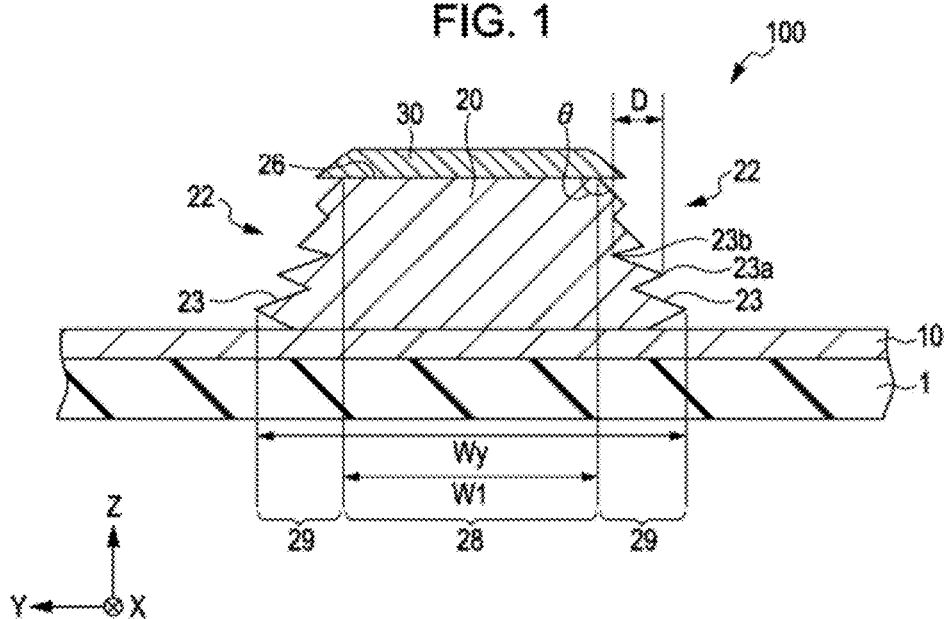
FIG. 1 is a cross-sectional view schematically showing a piezoelectric element according to the present embodiment.
Figure 2:
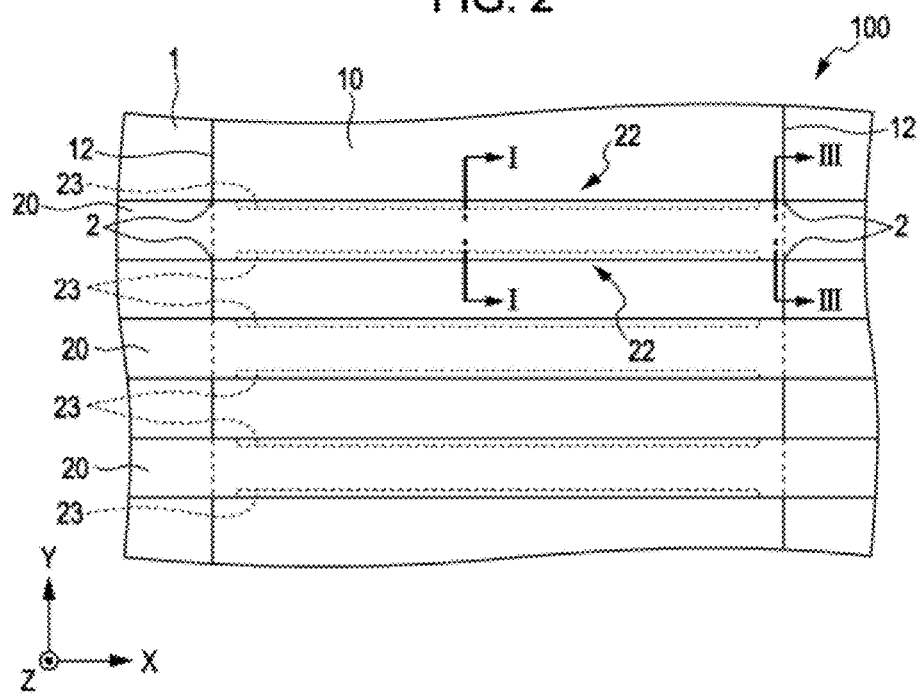
FIG. 2 is a plan view schematically showing a piezoelectric element according to the present embodiment.
Figure 3:
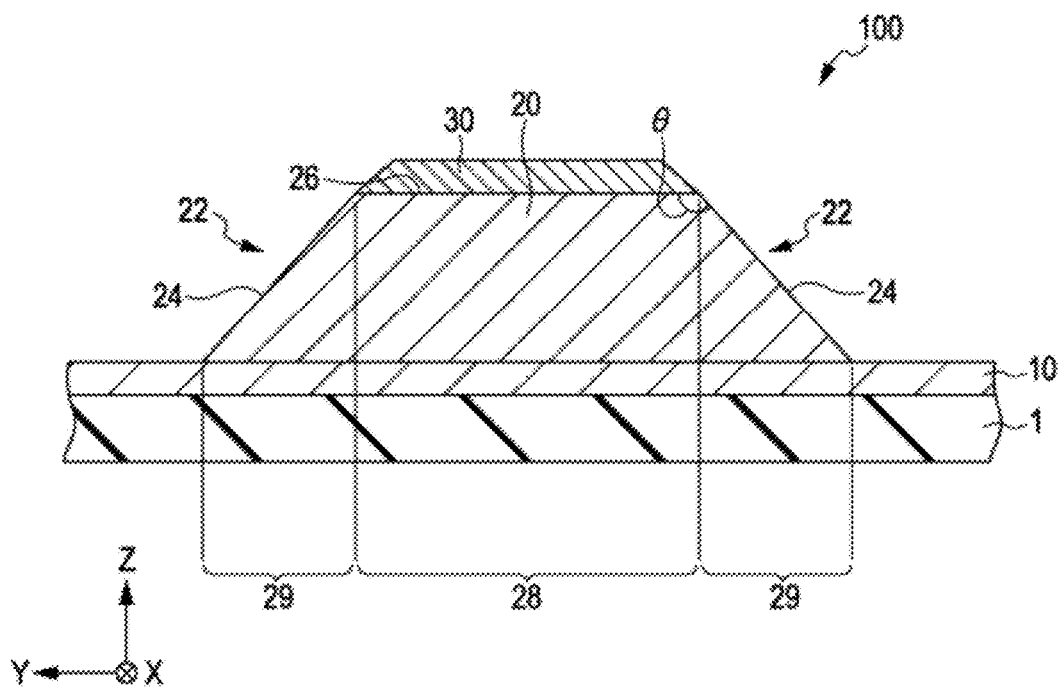
FIG. 3 is a cross-sectional view schematically showing a piezoelectric element according to the present embodiment.

First, the piezoelectric element according to the present embodiment will be described with reference to the drawings. FIG. 1 is a cross-sectional view schematically showing a piezoelectric element 100 according to the present embodiment. FIG. 2 is a plan view schematically showing a piezoelectric element 100 according to the present embodiment. FIG. 3 is a cross-sectional view schematically showing a piezoelectric element 100 according to the present embodiment. In addition, FIG. 1 is a cross-sectional view taken along the line I-I of FIG. 2, and FIG. 3 is a cross-sectional view taken along the line III-III of FIG. 2. Also, for convenience, the second electrode 30 is not shown in FIG. 2.

The piezoelectric element 100 includes, as shown in FIGS. 1 and 2, the first electrode 10, the piezoelectric layer 20, and the second electrode 30. The piezoelectric element 100 is formed on the substrate 1, for example.

Substrate 1, for example, is a flat plate formed by a semiconductor and an insulating body. The substrate 1 may be a single layer, or may be a structure in which a plurality of layers is laminated. As long as the upper surface is a flat shape, the internal structure of the substrate 1 is not limited and may be, for example, a structure formed with a space inside.

The substrate 1 has flexibility and may include a vibrating plate capable of being deformed (bending) by the operation of the piezoelectric layer 20. As the material of the vibrating plate, for example, silicon oxide, zirconium oxide, or laminates thereof may be exemplified.

The first electrode 10 is formed on the substrate 1. The shape of the first electrode 10, for example, is a layered shape or a thin film shape. The thickness of the first electrode 10 is, for example, 50 nm to 300 nm. As long as the piezoelectric layer 20 may be arranged between the first electrode 10 and the second electrode 30 which are arranged to face each other, the planar shape of the first electrode 10 is not particularly limited and may be a rectangle, for example.

As the material of the first electrode 10, for example, nickel, iridium, various metals such as platinum, conductive oxides thereof (for example, iridium oxide or the like), a composite oxide of strontium and ruthenium ($SrRuO_x$:SRO), and a composite oxide of lanthanum and nickel ($LaNiO_x$: LNO) may be exemplified. The first electrode layer 10 may be a single layer structure of the materials exemplified above, or may be a structure of a plurality of laminated materials.

The first electrode 10 is paired with the second electrode 30 and may be become one electrode (for example, a lower electrode formed under the piezoelectric layer 20) for applying a voltage to the piezoelectric layer 20.

In addition, the first electrode 10 may have a function as a vibrating plate when the substrate 1 does not have a vibrating plate. That is, the first electrode 10 may have a function as one electrode for applying a voltage to the piezoelectric layer 20 and a function as a vibrating plate capable of being deformed by the operation of the piezoelectric layer 20.

In addition, although not shown, between the first electrode 10 and the substrate 1, for example, a layer imparting adhesion to both, and a layer imparting strength and conductivity may be formed. As examples of such layers, for example, titanium, nickel, iridium, various metals such as platinum, and oxide layers thereof may be exemplified.

The piezoelectric layer 20, as shown in FIG. 1, is formed on the first electrode 10. The shape of the piezoelectric layer 20, for example, is a layered shape or a thin film shape. The thickness of the piezoelectric layer 20 is, for example, 300 nm to 3000 nm.

The piezoelectric layer 20 extends in the X axis direction in plan view as shown in FIG. 2. The piezoelectric layer 20 has a longitudinal direction along the X axis direction and a transverse direction along the Y axis direction. The piezoelectric layer 20 may intersect the first electrode 10. The piezoelectric layer 20 may be provided in a plurality. In the illustrated example, three piezoelectric layers 20 are provided; however, the number is not particularly limited to this. The plurality of piezoelectric layers 20, for example, is arranged in rows along the Y axis direction. In addition, the plurality of piezoelectric layer 20 may be integrally connected to each other at a part not shown.

At least a part of the side surface 22 of the piezoelectric layer 20, as shown in FIGS. 1 and 2, is the concavo-convex surface 23. In the example shown in FIG. 2, at least a part of the concavo-convex surface 23 is an inner side of the outer circumference 12 of the first electrode 10 and is formed on the side surface along the longitudinal direction (X axis direction) of the piezoelectric layer 20. The side surface 22 is the side surface in the transverse direction.

As shown in FIG. 1, a width of the piezoelectric layer 20 (a width of the transverse direction, that is, the length of the Y axis direction) Wy is from the second electrode 30 to the first electrode 10 and changes with the concavo-convex surface 23. In other words, the side surface 22 of the piezoelectric layer 20 follows the direction from the second electrode 30 toward the first electrode 10 and has concavities and convexities. The shape of the concavo-convex surface 23 is not particularly limited but, for example, the distance D in the Y axis direction between the apexes of adjacent convex parts 23a and the apexes of concave parts 23b is 50 nm to 1000 nm. In the illustrated example, four apexes 23a of the convex parts in one side surface 22 are formed; however, the number is not particularly limited to this.

The piezoelectric layer 20 has an active part 28 which is a substantial displacement driving portion, and an inactive part 29 which is not actively driven. The active part 28 is a portion of the piezoelectric layer 20 interposed between the first electrode 10 and the second electrode 30 and is a portion having a constant width (width of the transverse direction) W1. The width W1 in the direction from the second electrode 30 toward the first electrode 10 has a constant value. In the illustrated example, the width W1 of the active part 28 has the same minimum value as the width Wy of the piezoelectric layer 20, more specifically, the same length as the Y axis direction of the upper surface 26. The active part 28 is interposed between two inactive parts 29. The concavo-convex surface 23 configures an inactive part 29.

In the plan view as shown in FIG. 2, the piezoelectric layer 20 is formed across the outer circumference 12 of the first electrode 10. In other words, the piezoelectric layer 20 has a point 2 intersecting with the outer circumference 12. The side surface 22 (side surface 22 of the piezoelectric layer 20 at point 2) of the piezoelectric layer 20 which overlaps the outer circumference 12 is, as shown in FIG. 3, a flat surface. The side surface 22 of the piezoelectric layer 20 which overlaps the outer circumference 12 is connected to the upper surface 26 of the piezoelectric layer 20 at an obtuse angle θ.

As the piezoelectric layer 20, piezoelectric material of perovskite type oxides may be used. More specifically, as the material of the piezoelectric layer 20, for example, lead zirconate titanate ($Pb(Zr,Ti)O_3$:PZT), lead zirconate titanate niobate ($Pb(Zr,Ti,Nb)O_3$:PZTN), barium titanate ($BaTiO_3$), and potassium sodium niobate ($(K,Na)NbO_3$) may be exemplified.

The piezoelectric layer 20 may have a piezoelectric property and be deformed by the application of voltage by the first electrode 10 and the second electrode 30.

The second electrode 30 is formed on the piezoelectric layer 20. The second electrode 30 is arranged opposite the first electrode 10. The shape of the second electrode 30, for example, is a layered shape or a thin film shape. The thickness of the second electrode 30 is, for example, from 30 nm to 300 nm. As long as the piezoelectric layer 20 may be arranged between the first electrode 10 and the second electrode 30 which are arranged to face each other, the planar shape of the second electrode 30 is not particularly limited.

The material of the second electrode 30 may be, for example, nickel, iridium, various metals such as platinum, conductive oxides thereof (for example, iridium oxide or the like), a composite oxide of strontium and ruthenium ($SrRuO_x$: SRO), a composite oxide of lanthanum and nickel ($LaNiO_x$: LNO), or the like. The second electrode 30 may be a single layer structure of these exemplified materials, or may be a structure of a plurality of laminated materials.

As one function of the second electrode 30, the second electrode 30 may be paired with the first electrode 10 and become another electrode (for example, an upper electrode formed above the piezoelectric layer 20) for applying a voltage to the piezoelectric layer 20.

A plurality of second electrodes 30 may be provided corresponding to the plurality of piezoelectric layers 20. In the example shown in FIG. 2, three second electrodes 30 may be provided corresponding to the three piezoelectric layers 20. The plurality of second electrodes 30 may be electrically separated from each other. Meanwhile, the first electrode 10 may be a common electrode corresponding to the plurality of piezoelectric layers 20. In other words, the second electrode 30 may be a separate electrode and the first electrode 10 may be a common electrode corresponding to the plurality of piezoelectric layers 20. In this manner, each of the plurality of piezoelectric layers 20 may be driven independently. The second electrode 30 may have a longitudinal direction along the X axis direction and a transverse direction along the Y axis direction.

The above piezoelectric element 100, for example, may be applied to a liquid ejecting head, a liquid ejecting apparatus using the liquid ejecting head, or the like as a piezoelectric actuator pressurizing liquid in a pressure generating chamber, or may be used in other applications such as a piezoelectric sensor detecting deformation of the piezoelectric layer as an electric signal.

The piezoelectric element 100 according to the present embodiment, for example, has the following characteristics.

According to the piezoelectric element 100, at least a part of the side surface (side surface of the transverse direction) 22 of the piezoelectric layer 20 is a concavo-convex surface 23 and, from the second electrode 30 to the first electrode 10, the width (width of the transverse direction) Wy of the piezoelectric layer 20 is changed with the concavo-convex surface 23. Therefore, for example, compared a case where the side surface of the piezoelectric layer is a flat surface, it is possible to increase the length (length along the side surface 22 between the electrodes 10 and 30) of the side surface of between the first electrode 10 and the second electrode 30. Accordingly, it is possible to reduce the leakage current between the electrodes 10 and 30 passing through the side surface 22. Therefore, the piezoelectric layer 100 may be made to have high reliability.

In order to increase the length of the side surface between the electrodes, making the angle (θ shown in FIG. 1) of the side surface with respect to the upper surface of the piezoelectric layer may be considered. In such a form, even with a side surface of a flat piezoelectric layer, it is possible to increase the length of the side surface between the electrodes; however, the area of the inactive part is also increased. If the area of the inactive part is increased, the operation of the active part is limited by the inactive part and there is sometimes a problem in that the displacement amount of the piezoelectric element is deteriorated. In the piezoelectric element 100 according to the present embodiment, it is possible to increase the length of the side surface between the electrodes 10 and 30 while avoiding deterioration of such a displacement amount.

According to the piezoelectric element 100, the piezoelectric layer 20 and the first electrode 10 intersect in plan view, and the side surface 22 of the piezoelectric layer 20 overlapping the outer circumference 12 of the first electrode 10 may be a flat surface. The piezoelectric layer 20 overlapping the outer circumference 12 of the first electrode 10 is a portion where stress is easily concentrated as it is a boundary between the active part and the inactive part. In such a portion, the side surface 22 is set as a flat surface without the concavo-convex surface 23, and, by controlling the displacement, it is possible to suppress the generation of cracks or the like due to stress concentration.

2. Manufacturing Method of Piezoelectric Element

Next, a method for manufacturing the piezoelectric element 100 according to the present embodiment will be described with reference to the drawings. FIGS. 4A to 6B are views schematically showing the manufacturing process of the piezoelectric element 100 according to the present embodiment. In addition, in FIGS. 4A to 6B, FIGS. 4A, 5A and 6A are cross-sectional views corresponding to FIG. 1, and FIGS. 4B, 5B and 6B are plan views corresponding to FIG. 2.

Figure 4A:
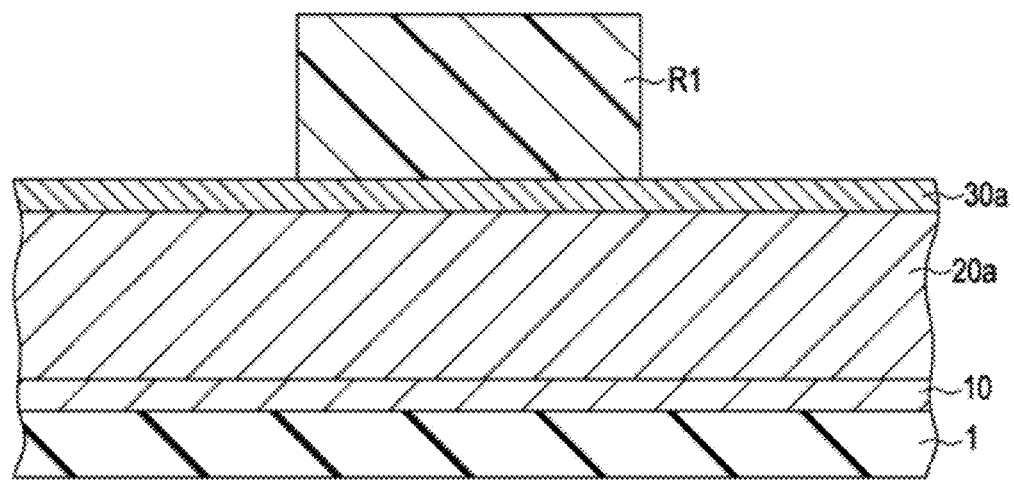
FIGS. 4A and 4B are a cross-sectional view and a plan view schematically showing a manufacturing process of the piezoelectric element according to the present embodiment.
Figure 4B:
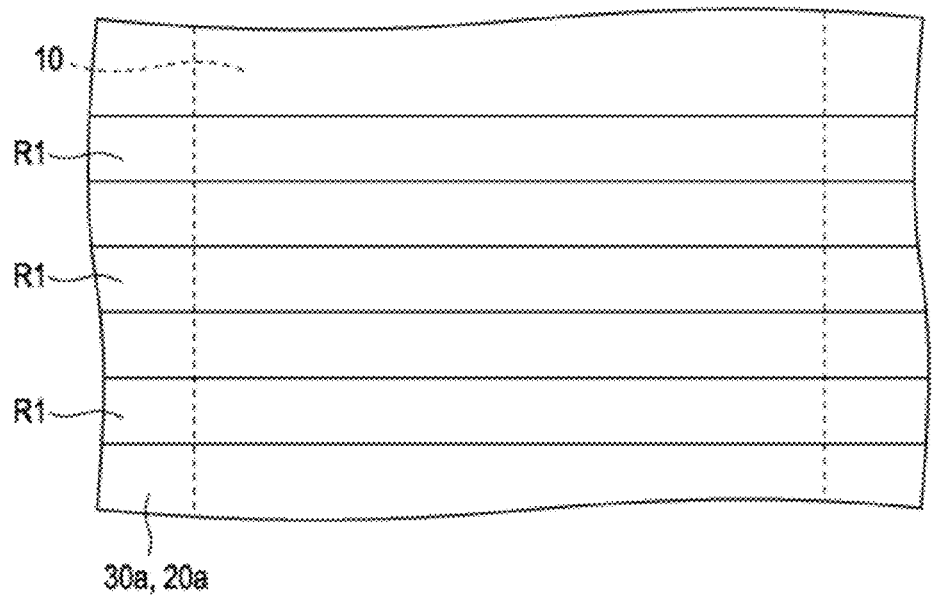

As shown in FIGS. 4A and 4B, the first electrode 10 is formed on the substrate 1. The first electrode 10, for example, is formed by depositing a conductive layer by a sputtering method, a plating method, a vacuum deposition method or the like, and patterning the conductive layer. The patterning, for example, is performed by photolithography and etching techniques.

Then, the piezoelectric layer 20a is deposited on the first electrode 10. The piezoelectric layer 20a is deposited by, for example, a sol-gel method, or a MOD (Metal Organic Deposition) method. More specifically, the piezoelectric precursor layer is deposited by spin coating and calcinated in an oxygen atmosphere at about 750° C., whereby the precursor layer is crystallized. By repeating this deposition and calcination several times, it is possible to obtain the piezoelectric layer 20a having a desired film thickness. For example, it is possible to determine the number of convex apexes 23a (refer to FIG. 1) using the number of depositions and calcination processes.

Next, a second electrode 30a is deposited on the piezoelectric layer 20a. The second electrode 30a, for example, is deposited by a sputtering method, a plating method, or a vacuum deposition method. Then, a resist R1 having a desired shape is formed on the piezoelectric layer 20a. The resist R1 is formed by a known method.

Figure 5A:
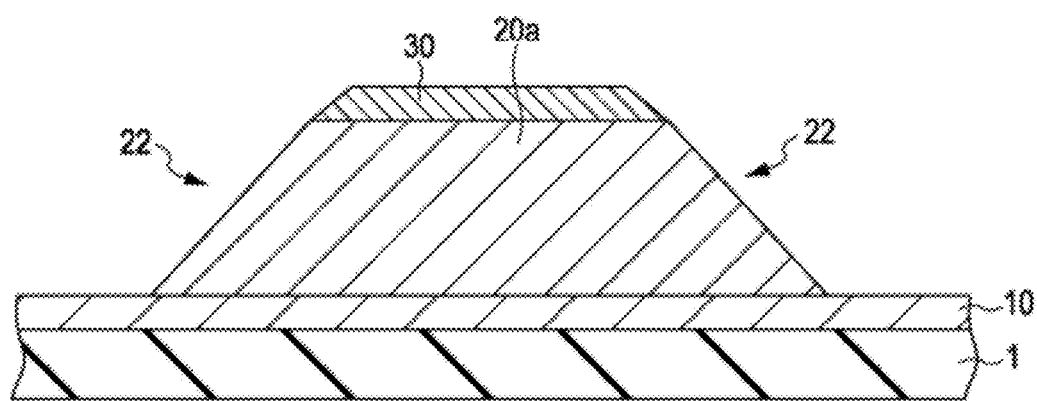
FIGS. 5A and 5B are a cross-sectional view and a plan view schematically showing a manufacturing process of the piezoelectric element according to the present embodiment.
Figure 5B:
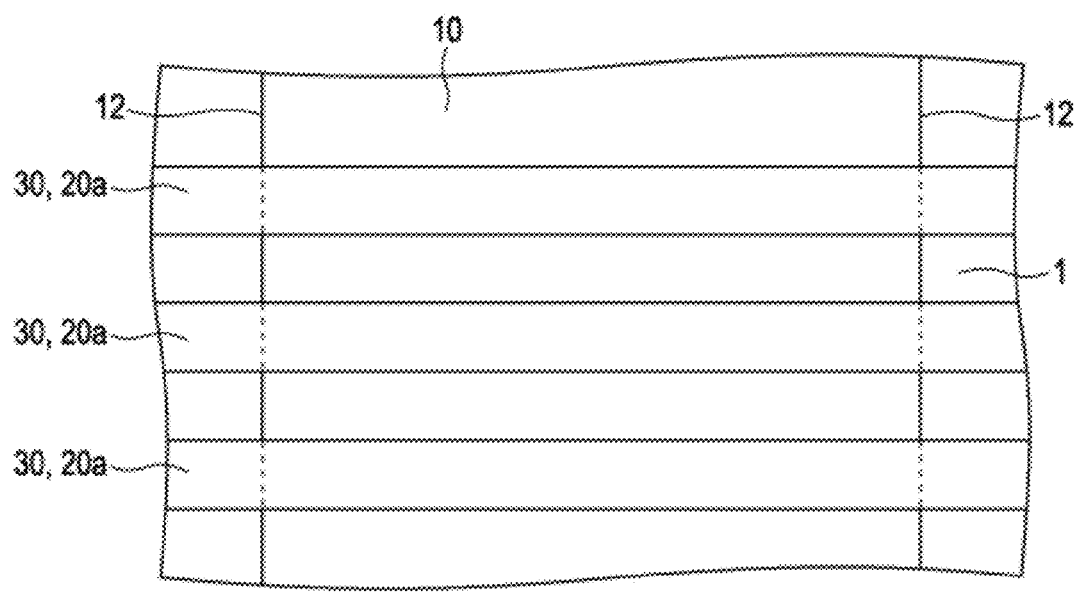

As shown in FIGS. 5A and 5B, a resist R1 is set as a mask and the second electrode 30a and the piezoelectric element 20a are etched. Thus, the second electrode 30 is formed. The etching, for example, is performed by dry etching using a gas mixture of chlorine and fluorine. Further, the resist R1 is removed by a known method.

Figure 6A:
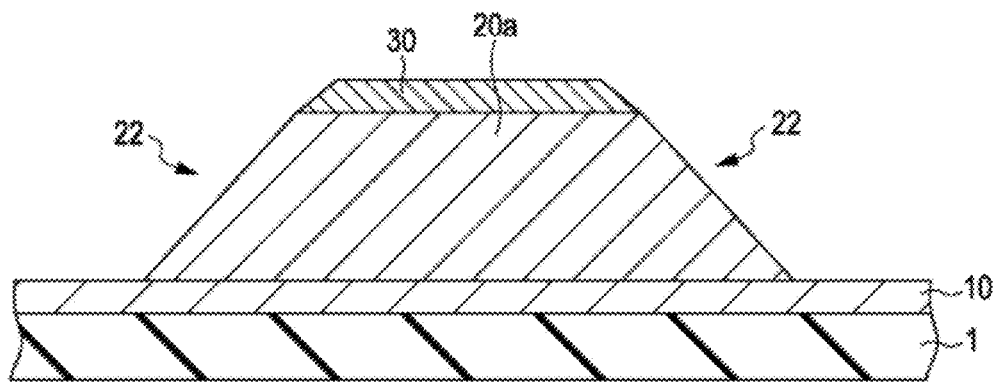
FIGS. 6A and 6B are a cross-sectional view and a plan view schematically showing a manufacturing process of the piezoelectric element according to the present embodiment.
Figure 6B:
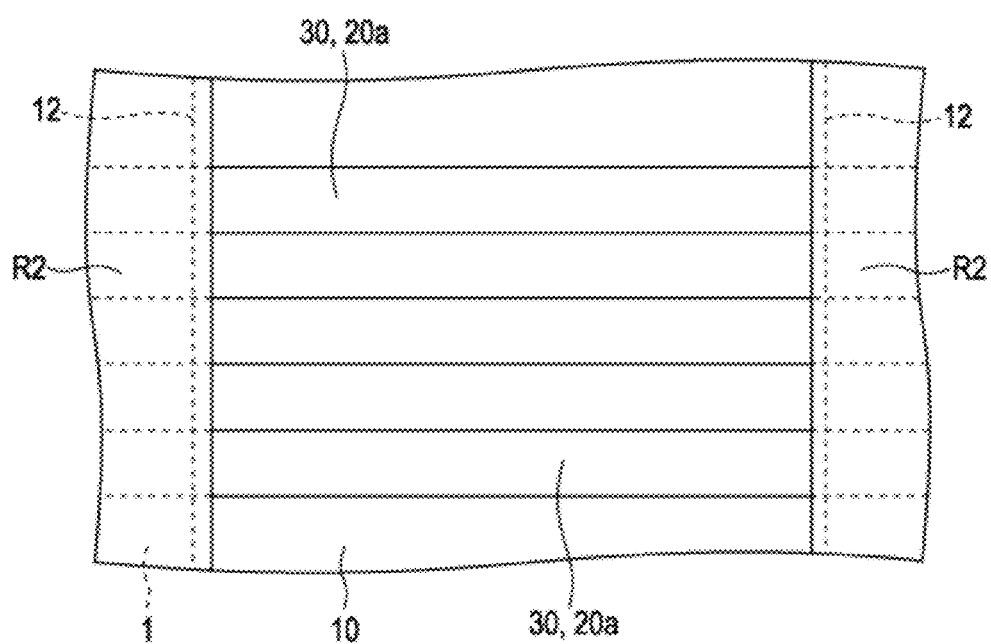

As shown in FIG. 6B, a resist R2 having a desired shape is formed in a region (region including a boundary line of the first electrode 10 and the substrate 1) including an outer circumference 12 of the first electrode 10. The resist R2 is formed by a known method.

As shown in FIGS. 1 and 2, the second electrode 30 and the resist R2 are set as a mask, and the piezoelectric layer 20a is etched to form the piezoelectric layer 20. The etching is performed by wet etching. As described above, when the piezoelectric layer 20a is formed by repeating the deposition and the calcination by spin coating several times, the calcination interface is easily selectively removed by wet etching. Therefore, it is possible to form a concavo-convex surface 23 on the side surface 22 of the piezoelectric layer 20. As an etchant for wet etching, for example, 20% buffered hydrofluoric acid, nitric acid, and a mixture of hydrochloric acid may be used. For example, the etching may be performed using a two-step method in which etching is performed only with buffered hydrofluoric acid, and the residue that arises as a result is removed with nitric acid. By using buffered hydrofluoric acid, it is possible to reduce the amount of side etching.

In addition, since the piezoelectric layer 20a overlapping the outer circumference 12 of the first electrode 10 is masked by the resist R2, as shown in FIG. 3, the side surface 22 of the piezoelectric layer 20 overlapping the outer circumference 12 may become a flat surface without performing etching by wet etching. Further, the resist R2 is removed by a known method.

Through the above steps, it is possible to manufacture a piezoelectric element 100.

According to the method of manufacturing the piezoelectric element 100, as described above, since it is possible to form a concavo-convex surface 23 at a side surface 22 of the piezoelectric layer 20, it is possible to form a piezoelectric element 100 having a high reliability.

Figure 7:
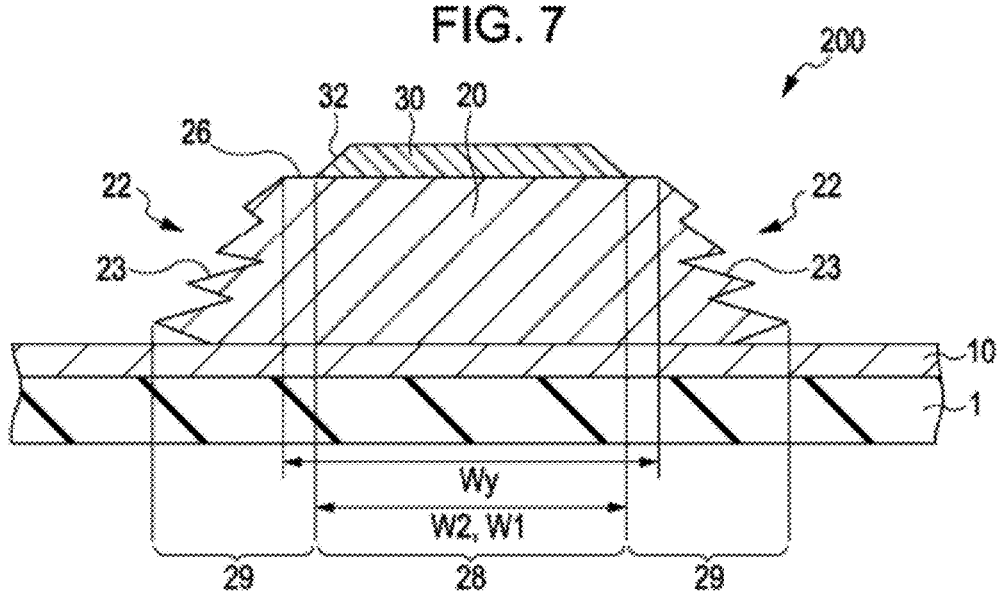
FIG. 7 is a cross-sectional view schematically showing a piezoelectric element according to a first modification of the present embodiment.

3. Modification of Piezoelectric Element 3.1. Piezoelectric Element According to First Modification Next, a piezoelectric element according to a first modification of the present embodiment will be described with reference to the drawings. FIG. 7 is a cross-sectional view schematically showing a piezoelectric element 200 according to the first modification of the present embodiment and corresponds to FIG. 1.

Below, in the piezoelectric element 200 according to a first modification of the present embodiment, the same reference numerals are given to constituent members having the same functions as those of the piezoelectric element 100 according to the present embodiment and description of the details thereof is omitted. The same applies to the piezoelectric element 300 according to a second modification of the present embodiment and the piezoelectric element 400 according to a third modification of the embodiment described below.

In the example of the piezoelectric element 100, as shown in FIG. 1, the width of the second electrode 30 was greater than the minimum width Wy of the piezoelectric layer 20.

In contrast, in the piezoelectric element 200, as shown in FIG. 7, the width W2 of the second electrode 30 (the width of the second electrode in the transverse direction and the maximum width of the second electrode 30) is smaller than the minimum value of the width Wy of the piezoelectric layer 20. In this manner, it is possible to determine the area of the active part 28 of the piezoelectric layer 20 according to the area of the second electrode 30. That is, the width W1 of the active part 28 is the same size as the width W2 of second electrode 30. In the illustrated example, the side surface (the side surface in the transverse direction) 32 of the second electrode 30 is connected to the upper surface 26 of the piezoelectric layer 20.

Figure 8:
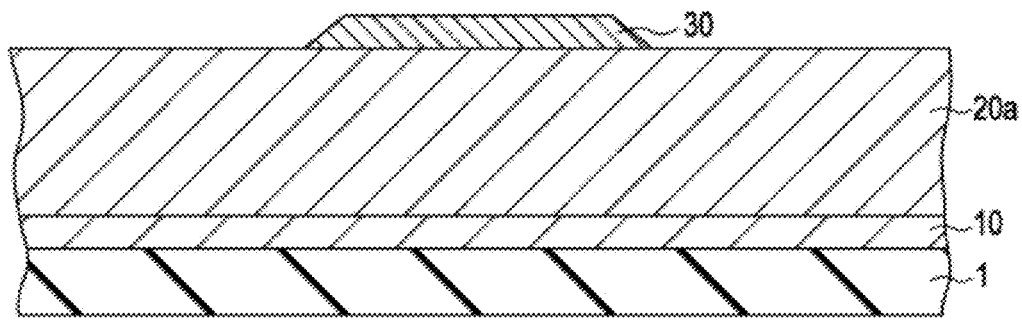
FIG. 8 is a cross-sectional view schematically showing a manufacturing process of the piezoelectric element according to the first modification of the present embodiment.
Figure 9:
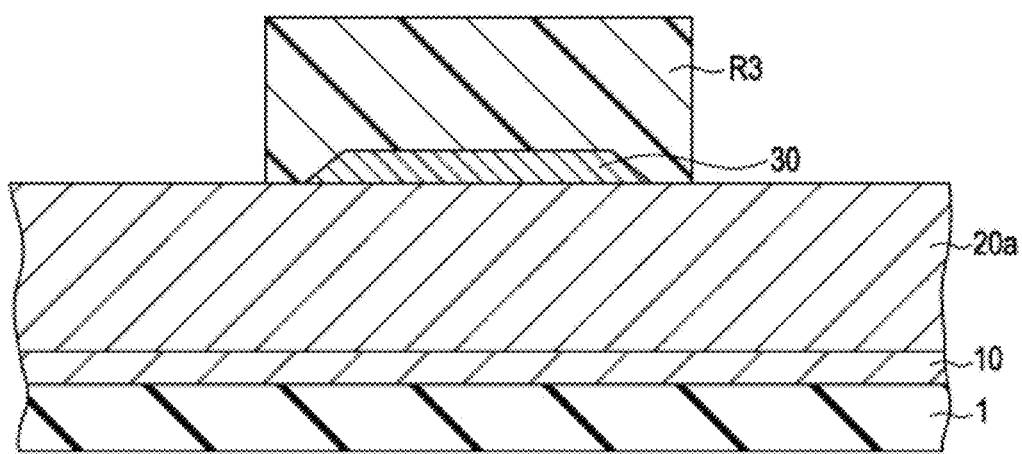
FIG. 9 is a cross-sectional view schematically showing a manufacturing process of the piezoelectric element according to the first modification of the present embodiment.

Next, a method for manufacturing the piezoelectric element 200 according to a first modification of the present embodiment will be described with reference to the drawings. FIGS. 8 and 9 are cross-sectional views schematically showing a manufacturing process of the piezoelectric element 200 according to a first modification of the present embodiment and correspond to FIG. 7. In addition, where the processes are basically the same as the manufacturing method of the piezoelectric element 100 of the present embodiment, description thereof will be simplified or omitted.

In the manufacturing method of the piezoelectric element 200, after forming the resist R1 on the second electrode 30a (refer to FIGS. 4A and 4B), as shown in FIG. 8, a resist R1 is set as a mask, the second electrode 30a is etched, and the second electrode 30 is formed.

As shown in FIG. 9, on the second electrode 30 and the piezoelectric layer 20a, a resist R3 having a desired shape is formed. The resist R3 is formed by a known method. The resist R3 has a larger area than the area of the second electrode 30. The difference between the dimensions of the resist R3 and the dimensions of the second electrode 30 is preferably greater than the side etching amount generated in the piezoelectric layer 20a in the wet etching to be described below.

As shown in FIG. 7, a resist R3 is set as a mask and the piezoelectric layer 20a is etched. The etching is performed by wet etching. Thus, it is possible to form the piezoelectric layer 20 having a concavo-convex surface 23. Further, the resist R3 is removed by a known method.

According to the above steps, it is possible to manufacture a piezoelectric element 200.

3. 2. Piezoelectric Element According to Second Modification

Figure 10:
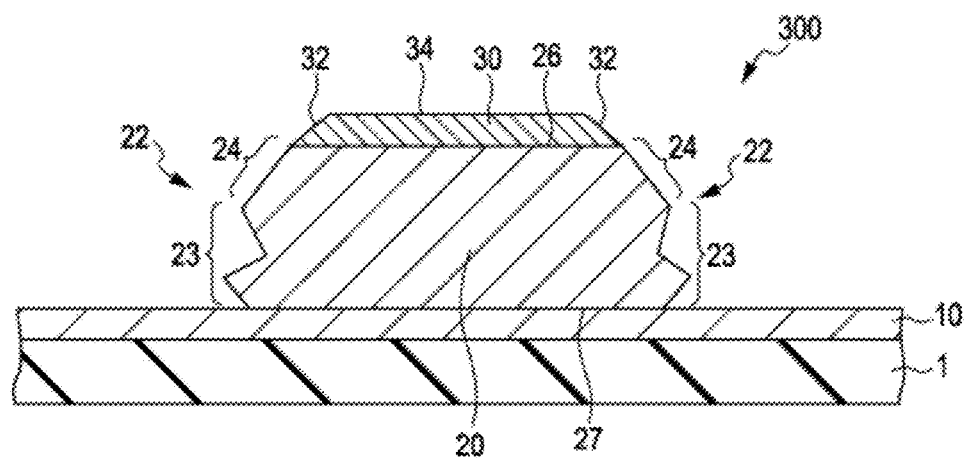
FIG. 10 is a cross-sectional view schematically showing a piezoelectric element according to a second modification of the present embodiment.

Next, a piezoelectric element according to a second modification of the present embodiment will be described with reference to the drawings. FIG. 10 is a cross-sectional view schematically showing a piezoelectric element 300 according to a second modification of the present embodiment and corresponds to FIG. 1.

In the piezoelectric element 300, as shown in FIG. 10, the side surface 22 of the piezoelectric layer 20 is configured by the concavo-convex surface 23 and the flat surface 24. The flat surface 24 is connected to the upper surface 26 of the piezoelectric layer 20. The concavo-convex surface 23 is connected to the flat surface 24 and also connected to the lower surface 27 of the piezoelectric layer 20. In the illustrated example, the side surface 32 of the second electrode 30 is connected to the side surface (flat surface 24) of the piezoelectric layer 20. The flat surface 24 and side surface 32 of the second electrode 30 are continuous.

Figure 11:
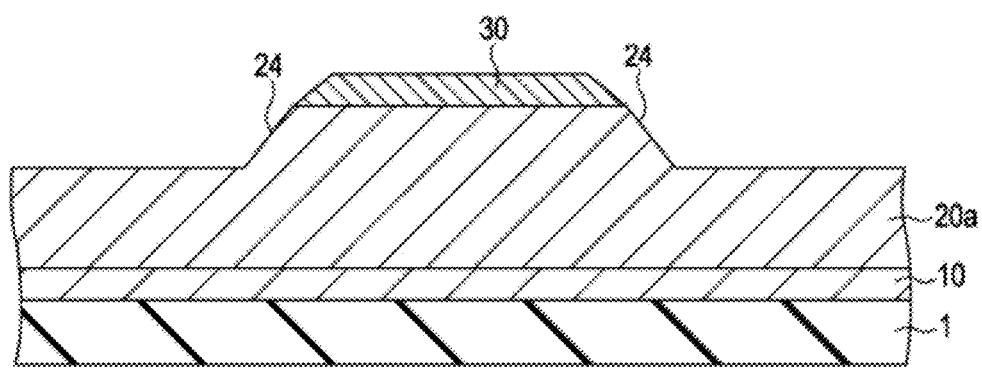
FIG. 11 is a cross-sectional view schematically showing a manufacturing process of the piezoelectric element according to the second modification of the present embodiment.
Figure 12:
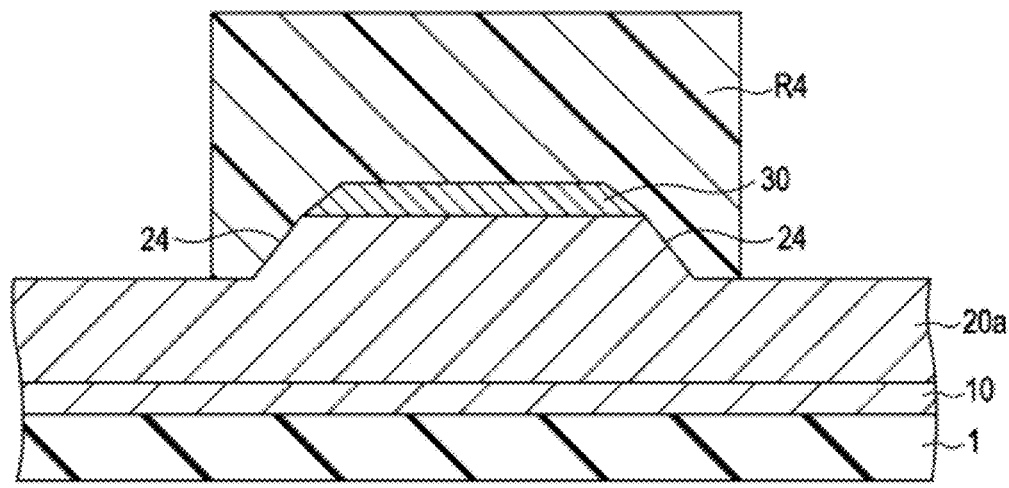
FIG. 12 is a cross-sectional view schematically showing a manufacturing process of the piezoelectric element according to the second modification of the present embodiment.

Next, a method for manufacturing a piezoelectric element 300 according to a second modification of the present embodiment will be described with reference to the drawings. FIGS. 11 and 12 are cross-sectional views schematically showing a manufacturing process of the piezoelectric element 300 according to a second modification of the present embodiment and correspond to FIG. 10. In addition, where the processes are basically the same as the manufacturing method of the piezoelectric element 100 of the present embodiment, description thereof will be simplified or omitted.

In the manufacturing method of the piezoelectric element 300, after forming the resist R1 on the second electrode 30a (refer to FIGS. 4A and 4B), as shown in FIG. 11, a resist R1 is set as a mask and the second electrode 30a and the piezoelectric layer 20a are partially etched. In this manner, the flat surface 24 is formed. It is possible to determine the size of the flat surface 24 by the etching amount of the piezoelectric layer 20a.

As shown in FIG. 12, on the second electrode 30 and the piezoelectric layer 20a, a resist R4 having a desired shape is formed. The resist R4 has a larger area than the area of the second electrode 30 and is formed so as to cover the second electrode 30 and the flat surface 24. The resist R4 is formed by a known method.

As shown in FIG. 10, a resist R4 is set as a mask and the piezoelectric layer 20a is etched. The etching is performed by wet etching. Thus, the concavo-convex surface 23 is formed and it is possible to form the piezoelectric layer 20 having the concavo-convex surface 23 and the flat surface 24. Further, the resist R4 is removed by a known method.

Through the above processes, it is possible to manufacture a piezoelectric element 300.

Next, another manufacturing method of a piezoelectric element 300 according to a second modification of the present embodiment will be described with reference to the drawings. FIGS. 13 to 16 are cross-sectional views schematically showing a manufacturing process of the piezoelectric element 300 according to a second modification of the present embodiment and correspond to FIG. 10. In addition, where the processes are basically the same as the manufacturing method of the piezoelectric element 100 of the present embodiment, description thereof will be simplified or omitted.

Figure 13:
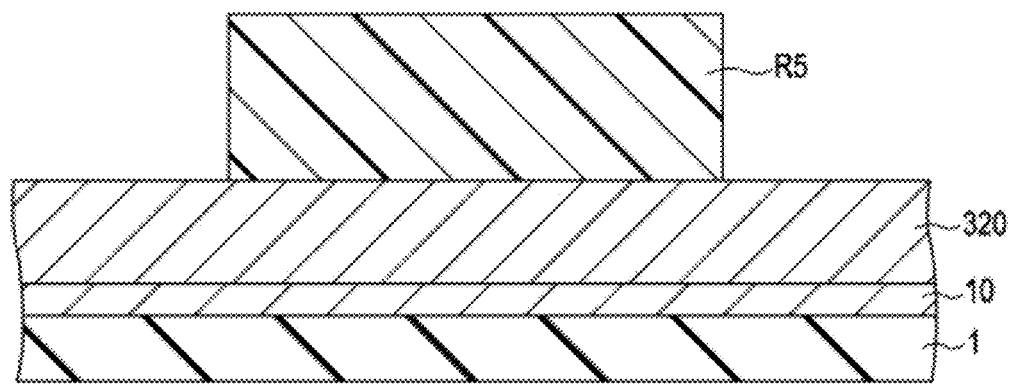
FIG. 13 is a cross-sectional view schematically showing a manufacturing process of the piezoelectric element according to the second modification of the present embodiment.

In another manufacturing method of the piezoelectric element 300, as shown in FIG. 13, the first piezoelectric layer 320 is deposited on the first electrode 10. The first piezoelectric layer 320 is deposited by a sol-gel method, or an MOD method. More specifically, the piezoelectric precursor layer is deposited by spin coating and calcinated in an oxygen atmosphere at about 750° C., whereby the precursor layer is crystallized. By repeating this deposition and calcination process several times, it is possible to obtain the first piezoelectric layer 320 having a desired film thickness. Next, a resist R5 having a desired shape is formed on the piezoelectric layer 320. The resist R5 is formed by a known method.

Figure 14:
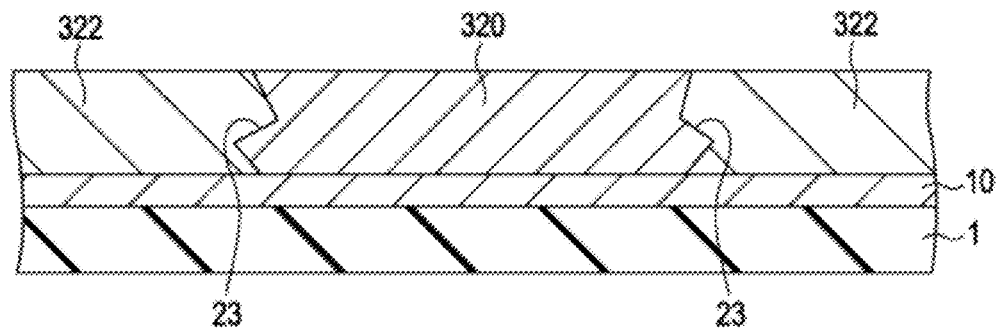
FIG. 14 is a cross-sectional view schematically showing a manufacturing process of the piezoelectric element according to the second modification of the present embodiment.

As shown in FIG. 14, a resist R5 is set as a mask and a first piezoelectric layer 320 is etched. The etching is performed by wet etching using buffered hydrofluoric acid as an etchant. In this manner, it is possible to form the concavo-convex surface 23 on the side surface of the first piezoelectric layer 320. Here, the buffered hydrofluoric acid is adjusted so as to only melt the material of the part forming at least the first piezoelectric layer 320. Alternatively, the buffered hydrofluoric acid may be adjusted so as to selectively dissolve a portion of the first piezoelectric layer 320 where crystals are not properly formed, such as the grain boundaries. By wet etching using such a buffered hydrofluoric acid, without removing the entire first piezoelectric layer 320, a reactant reacted with an oxide including unmelted elements and components of the etching solution is left. In this manner, it is possible to form a porous layer 322 of porous material.

Figure 15:
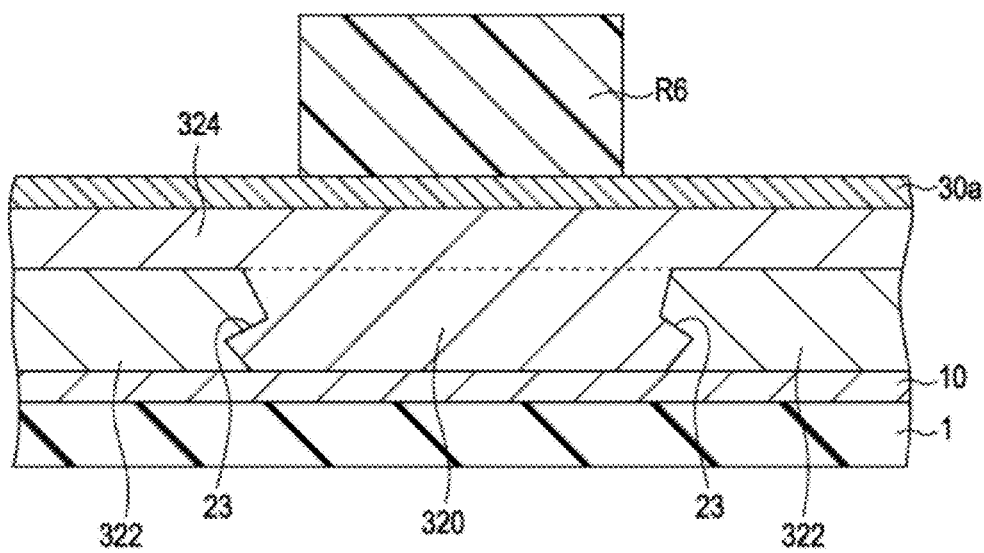
FIG. 15 is a cross-sectional view schematically showing a manufacturing process of the piezoelectric element according to the second modification of the present embodiment.

As shown in FIG. 15, a second piezoelectric layer 324 is deposited on the first piezoelectric layer 320 and the porous layer 322. The second piezoelectric layer 324 is deposited by the same method as the first piezoelectric layer 320, for example. Next, a second electrode 30a is deposited on the second piezoelectric layer 324. Then, a resist R6 having a desired shape is formed on the second electrode 30a. The resist R6 is formed by a known method.

Figure 16:
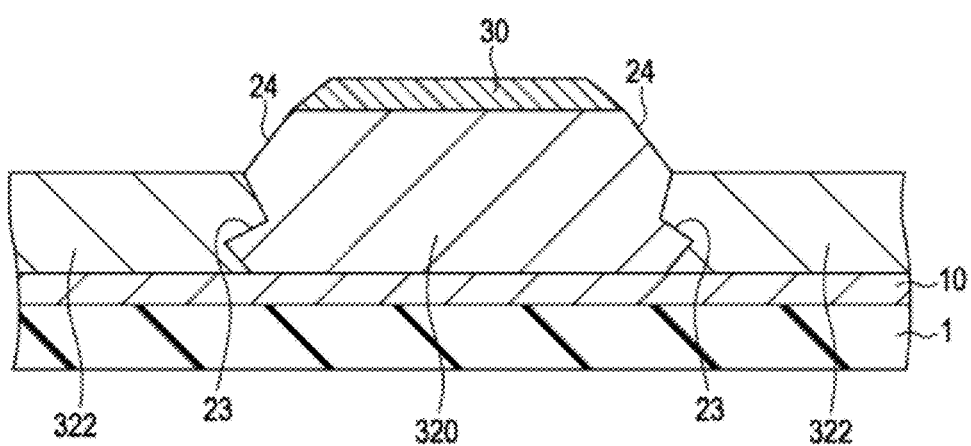
FIG. 16 is a cross-sectional view schematically showing a manufacturing process of the piezoelectric element according to the second modification of the present embodiment.

As shown in FIG. 16, a resist R6 is set as a mask, the second electrode 30a and the piezoelectric layer 324 are etched, and the second electrode 30 and the piezoelectric layer 20 are formed. The etching is performed by dry etching. In this manner, it is possible to form a flat surface 24. Further, the resist R6 is removed by a known method.

As shown in FIG. 10, the porous layer 322 is selectively removed by etching. The etching, for example, is performed by wet etching using nitric acid as an etchant.

According to the above processes, it is possible to manufacture a piezoelectric element 300. According to the manufacturing method shown in FIGS. 13 to 16, it is possible to determine the region forming the concavo-convex surface 23 by the thickness of the first piezoelectric layer 320. That is, the region forming the concavo-convex surface 23 can be formed with high accuracy.

3. 3. Piezoelectric Element According to Third Modification

Figure 17:
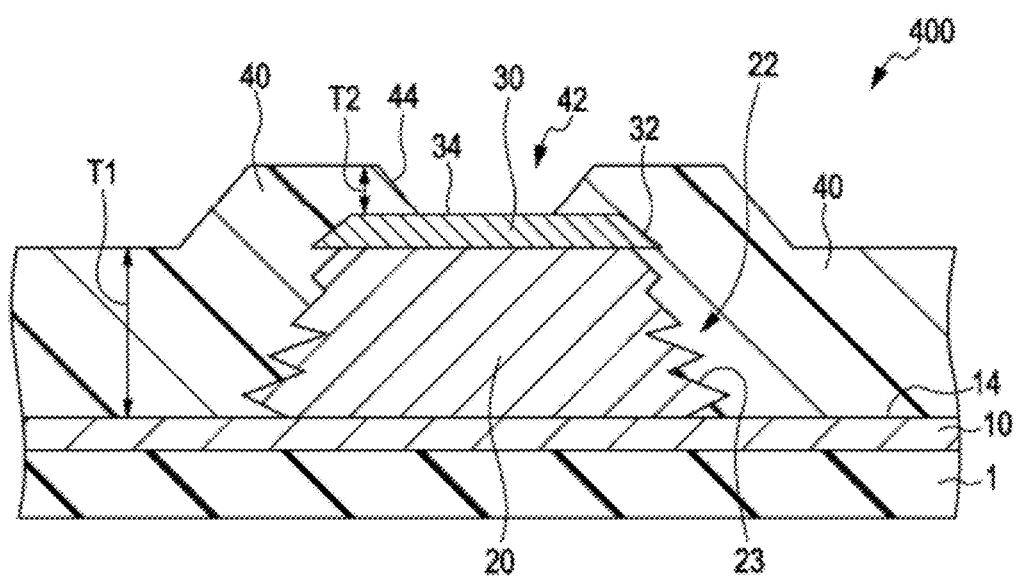
FIG. 17 is a cross-sectional view schematically showing a piezoelectric element according to a third modification of the present embodiment.

Next, a piezoelectric element according to a third modification of the present embodiment will be described with reference to the drawings. FIG. 17 is a cross-sectional view schematically showing a piezoelectric element 400 according to a third modification of the present embodiment and corresponds to FIG. 1.

The piezoelectric element 400 has a coating layer 40, as shown in FIG. 17. The coating layer 40 is formed to cover the upper surface 14 of the first electrode 10, the side surface 22 of the piezoelectric layer 20, the side surface 32 of the second electrode 30, and a part of the upper surface 34 of the second electrode 30. The coating layer 40 may have a function of protecting the piezoelectric layer 20 from moisture or the like.

As the coating layer 40, it is possible to use as material having a lower Young's modulus than the piezoelectric layer 20. Specifically, as the material of the coating layer 40, a polyimide may be exemplified. In this manner, even if the coating layer 40 is formed on the surface side 22 of the piezoelectric layer 20, deterioration of the displacement amount of the piezoelectric layer 20 can be suppressed.

The thickness T1 of the coating layer 40 formed on the upper surface 14 of the first electrode 10 is larger than the thickness T2 of the coating layer 40 formed on the upper surface 34 of the second electrode 30. The thickness T1, for example, is about 1 μm, and the thickness T2, for example, is about 0.5 μm. Thus, it is possible to reliably protect the side surface 22 of the piezoelectric layer 20 using the coating layer 40, whereby it is possible to improve reliability.

The coating layer 40 formed on the upper surface 34 of the second electrode 30 may have an opening 42. A part of the upper surface 34 of the second electrode 30 may be exposed through the opening 42. Using the opening 42, it is possible to suppress the deterioration of the displacement amount of the piezoelectric layer 20 even when the coating layer 40 is formed. The side surface 44 of the coating layer 40 connected to the upper surface 34 of the second electrode 30 may be inclined with respect to the upper surface 34 of the second electrode 30.

Next, a manufacturing method for a piezoelectric element 400 according to a modification of the third embodiment will be described. In addition, where the processes are basically the same as the manufacturing method of the piezoelectric element 100 of the present embodiment, description thereof will be simplified or omitted.

In the manufacturing method of the piezoelectric element 400, after forming the piezoelectric layer 20 (refer to FIGS. 6A and 6B), a coating layer 40 is formed so as to cover the first electrode 10, the piezoelectric layer 20 and the second electrode 30. The coating layer 40 is deposited by spin coating. Also, as necessary, a heating process may be performed for curing the coating layer 40. In this manner, the thickness T1 of the coating layer 40 formed on the upper surface 14 of the first electrode 10 may be made larger than the thickness T2 of the coating layer 40 formed on the upper surface 34 of the second electrode 30.

Next, the coating layer 40 formed on the upper surface 34 of the second electrode 30 is patterned to form an opening 42. If the material of the coating layer 40 is a photosensitive polyimide, it is possible to form an opening 42 by exposure only without using an etching process. Therefore, it is possible to reduce manufacturing costs.

Through the above steps, it is possible to manufacture a piezoelectric element 400 according to a third modification of the present embodiment.

3. 4. Piezoelectric Element According to Fourth Modification

Figure 18:
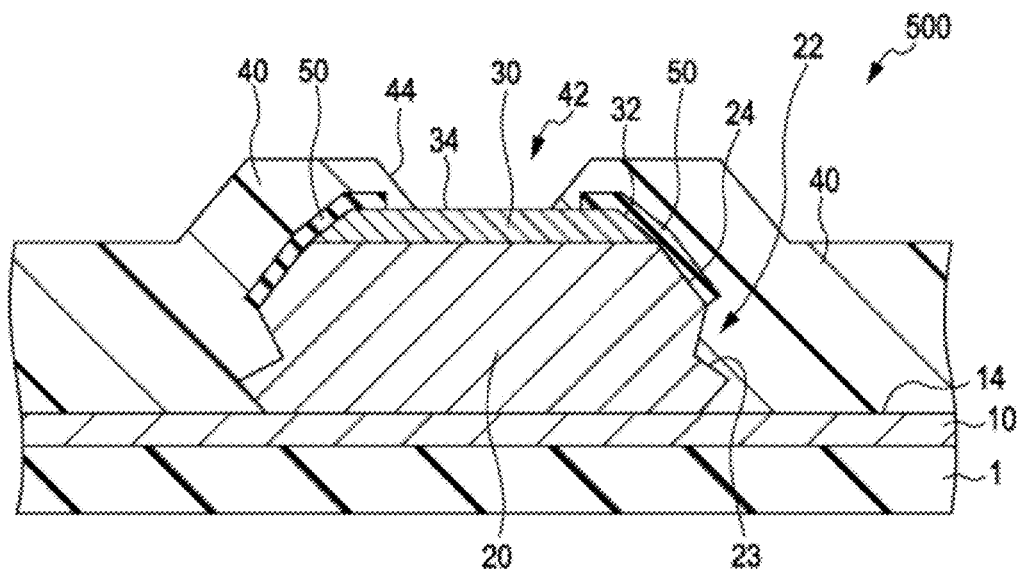
FIG. 18 is a cross-sectional view schematically showing a piezoelectric element according to a fourth modification of the present embodiment.

Next, a piezoelectric element according to a fourth modification of the present embodiment will be described with reference to the drawings. FIG. 18 is a cross-sectional view schematically showing a piezoelectric element 500 according to a fourth modification of the present embodiment and corresponds to FIG. 10. Below, in the piezoelectric element 500 according to a fourth modification of the present embodiment, the same reference numerals are given to constituent members having the same functions as those of the piezoelectric element 300 according to the second modification of the present embodiment and description of the details thereof is omitted.

The piezoelectric element 500 has a coating layer (also referred to as a first coating layer 50) as shown in FIG. 18. The coating layer 50 is formed to cover the flat surface 24 and the side surface 32 of the second electrode 30. Since the flat surface 24 and the side surface 32 of the second electrode 30 are continuous, the coating layer 50 may be formed without defects at the interface between the piezoelectric layer 20 and the second electrode 30. The thickness of the coating layer 50, for example, is about 100 nm.

As the material of the coating layer 50, for example, aluminum oxide, silicon nitride, and the like may be exemplified. In this manner, it is possible to more reliably prevent moisture or the like from entering the interface of the piezoelectric layer 20 and the second electrode 30.

The coating layer 40 (also referred to as the second coating layer 40) is formed to cover the concavo-convex surface 23 and the coating layer 50. Young's modulus of the coating layer 40 is smaller than Young's modulus of the piezoelectric layer 20 and Young's modulus of the coating layer 50. Specifically, as the material of the coating layer 40, a polyimide may be exemplified. In this manner, deterioration of the displacement amount of the piezoelectric layer 20 can be suppressed even while preventing moisture or the like from entering the interface of the piezoelectric layer 20 and the second electrode 30. For example, when the side surface 22 of the piezoelectric layer 20 was projected onto the XZ plane, the area of the flat surface 24 may be equal to or less than half the area of the concavo-convex surface 23. In this manner, it is possible to reduce the area where the coating layer 50 is formed and more reliably suppress deterioration of the displacement amount of the piezoelectric layer 20. The description of the other coating layer 40 may be applied to the description using the piezoelectric element 400 according to the third modification of the embodiment described above.

Figure 19:
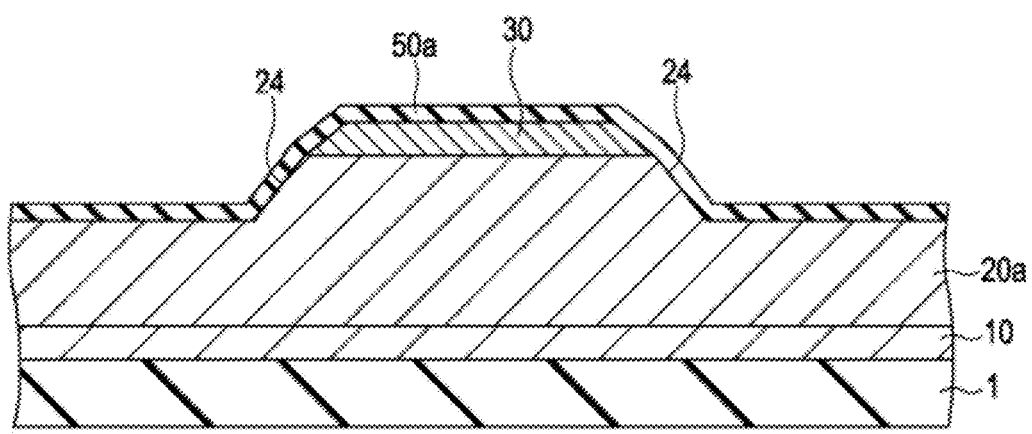
FIG. 19 is a cross-sectional view schematically showing a manufacturing process of the piezoelectric element according to the fourth modification of the present embodiment.
Figure 20:
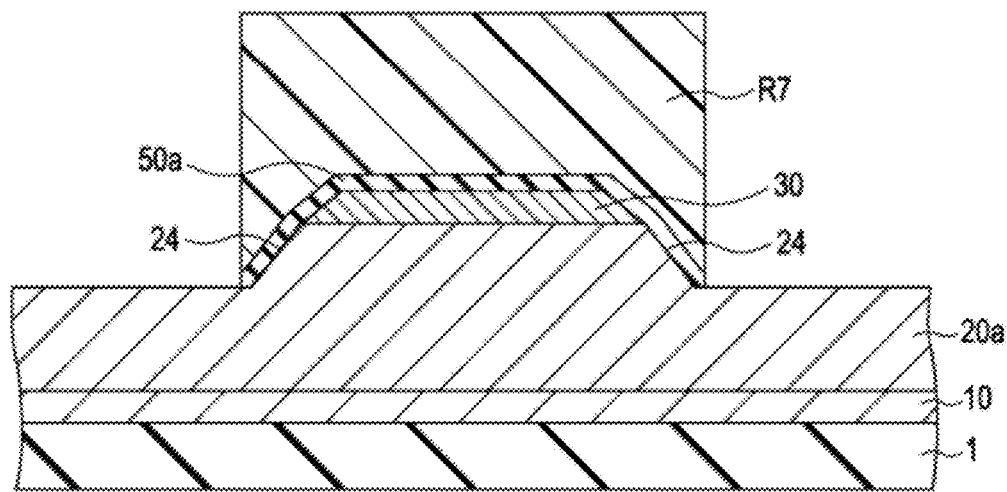
FIG. 20 is a cross-sectional view schematically showing a manufacturing process of the piezoelectric element according to the fourth modification of the present embodiment.
Figure 21:
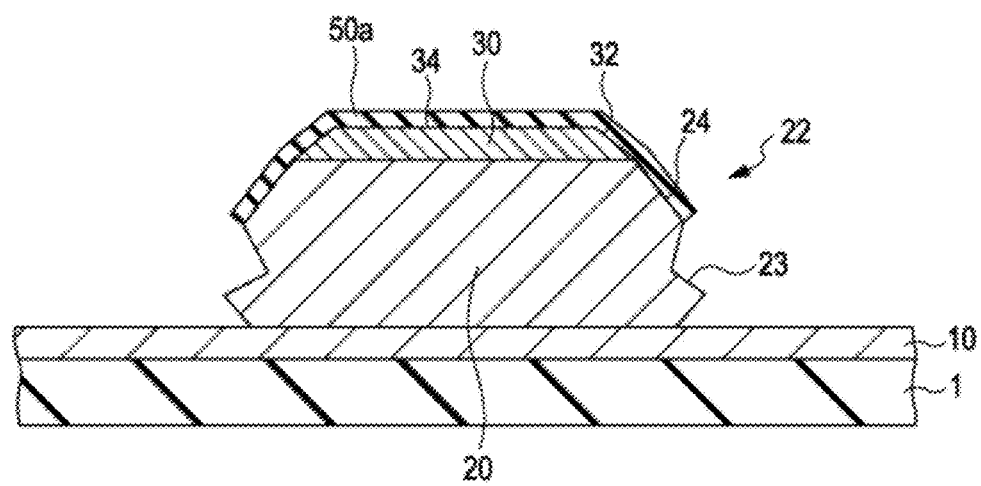
FIG. 21 is a cross-sectional view schematically showing a manufacturing process of the piezoelectric element according to the fourth modification of the present embodiment.

Next, a manufacturing method for a piezoelectric element 500 according to a fourth modification of the embodiment will be described. FIGS. 19 to 21 are cross-sectional views schematically showing a manufacturing process of the piezoelectric element 500 according to a fourth modification of the present embodiment and correspond to FIG. 18. In addition, where the processes are basically the same as the manufacturing method of the piezoelectric element 300 according to the second modification of the embodiment, description thereof will be simplified or omitted.

In the manufacturing method of the piezoelectric element 500, after etching a part of the piezoelectric layer 20a and forming the flat surface 24 (refer to FIG. 11), as shown in FIG. 19, the coating layer 50a is deposited on the second electrode 30 and the piezoelectric layer 20a. The coating layer 50a is, for example, deposited by a CVD (Chemical Vapor Deposition) method.

As shown in FIG. 20, a resist R7 is formed so as to cover the coating layer 50a on the second electrode 30 and the coating layer 50a on the flat surface 24. The resist R7 is formed by a known method. Next, the resist R7 is set as a mask and the coating layer 50a is etched. The etching, for example, is performed by dry etching using chlorine gas. Further, the resist R7 is removed by a known method.

As shown in FIG. 21, the coating layer 50a is set as a mask, wet etching is performed on the piezoelectric layer 20a, and the piezoelectric layer 20 having a concavo-convex surface 23 is formed.

As shown in FIG. 18, the coating layer 50a is patterned to form a coating layer 50. Then, for example, a coating layer 40 having an opening 42 is formed by spin coating.

Through the above steps, it is possible to manufacture a piezoelectric element 500.

4. Test Example

The invention will be described in more detail through the test example shown below. The invention is not in limited by the following test example.

4. 1. Sample Preparation 200 nm of platinum was deposited on a silicon substrate by a sputtering method to form a first electrode. Next, a precursor of PZT was deposited by spin coating, and calcinated in an oxygen atmosphere at 750° C. By repeating this deposition and calcination process five times, 1 μm of PZT was formed and set as a piezoelectric layer. Then, on the PZT, 100 nm of iridium was deposited by a sputtering method and set as the second electrode.

Then, with the resist set as a mask, dry etching was performed on the iridium and the PZT. The dry etching was performed using a gas mixture of chlorine and fluorine. Then, the PZT was etched by wet etching. The wet etching was performed using a liquid mixture of 20% buffered hydrofluoric acid, nitric acid, and chlorine.

4. 2. SEM Observation Result

Figure 22:
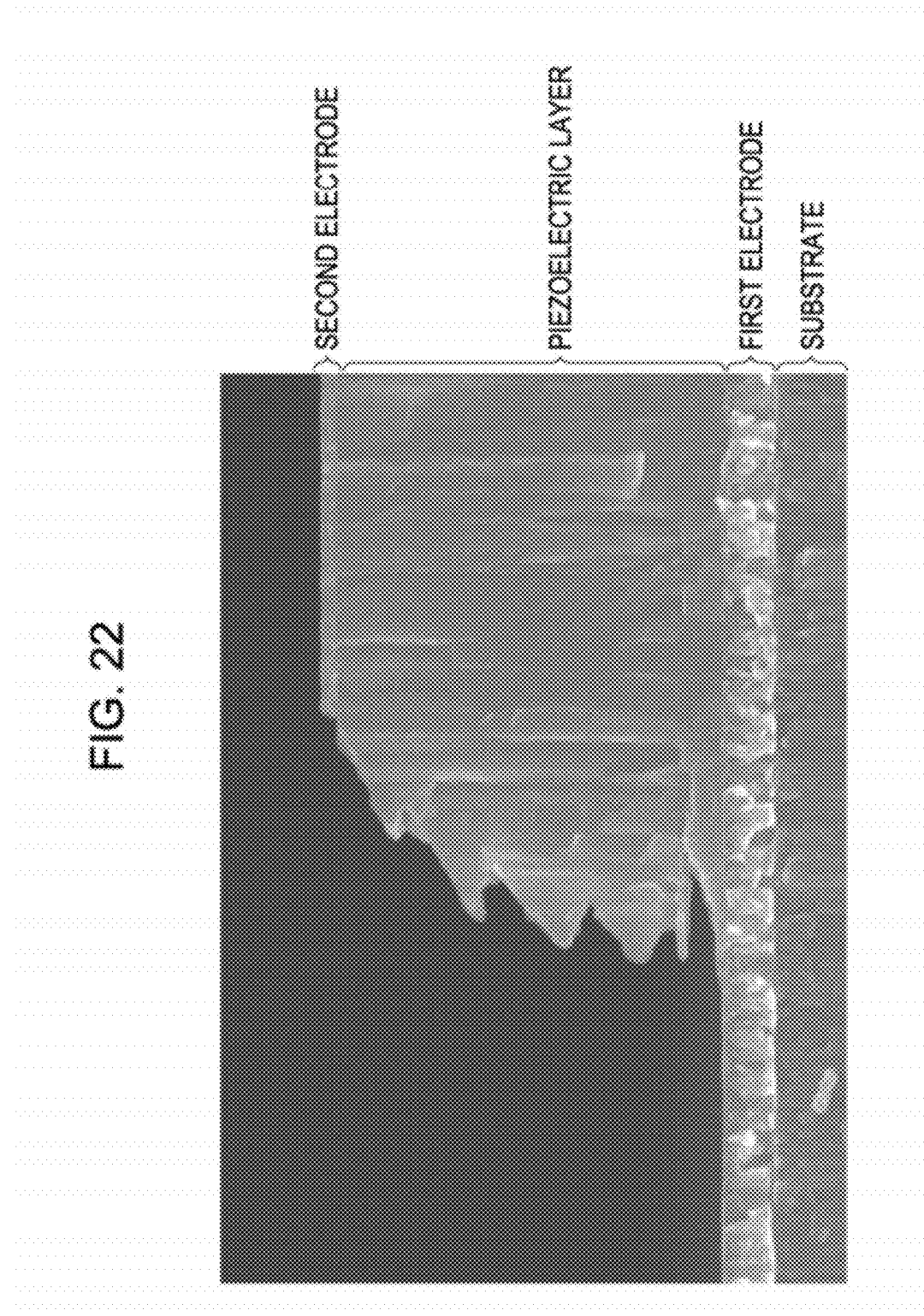
FIG. 22 is an SEM observation result of a test example according to the present embodiment.

FIG. 22 shows the SEM observation result of the sample prepared as described above. From FIG. 22, it was found that the concavo-convex surface is formed on the side surface of the PZT.

5. Liquid Ejecting Head

Figure 23:
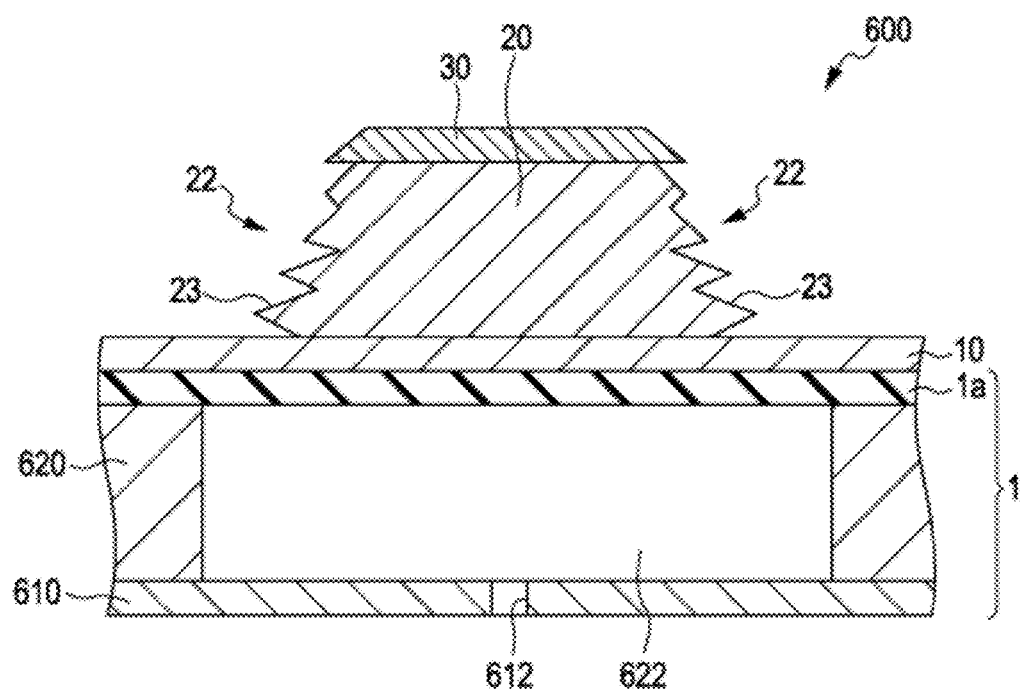
FIG. 23 is a cross-sectional view schematically showing a liquid ejecting head according to the present embodiment.
Figure 24:
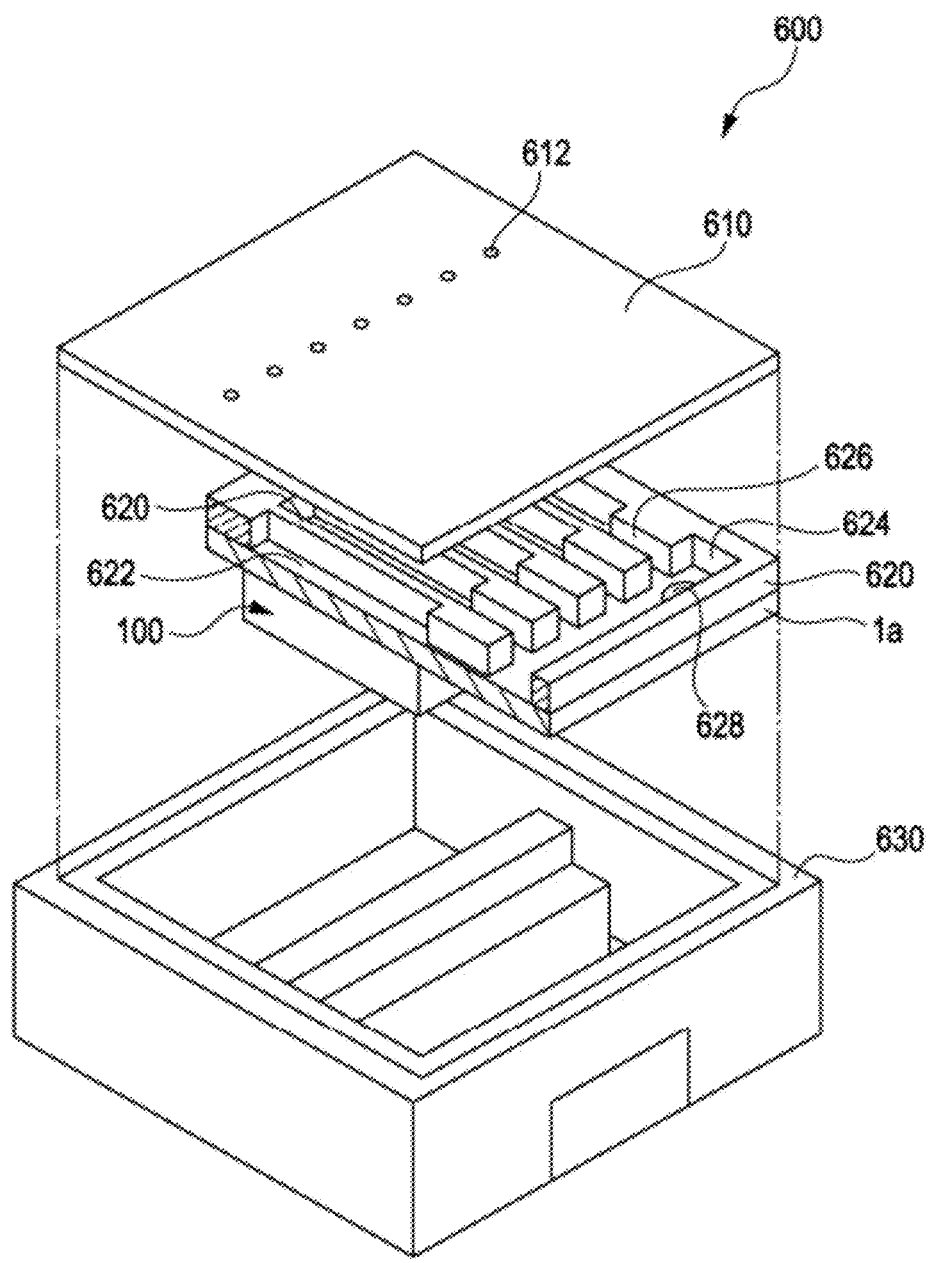
FIG. 24 is an exploded perspective view showing a liquid ejecting head according to the present embodiment.

Next, the liquid ejecting head according to the embodiment will be described with reference to the drawings. FIG. 23 is a cross-sectional view schematically showing main parts of a liquid ejecting head 600. FIG. 24 is an exploded perspective view of the liquid ejecting head 600 and shows a typical use state upside down.

The liquid ejecting head 600 has a piezoelectric element according to the invention. Below, an example of using the piezoelectric element 100 as the piezoelectric element according to the invention will be described.

As shown in FIGS. 23 and 24, the liquid ejecting head 600 includes a vibrating plate 1a, a nozzle plate 610, a flow path forming substrate 620, a piezoelectric element 100, and a housing 630, for example. Further, in FIG. 24, the piezoelectric element 100 is simplified and illustrated.

As shown in FIG. 23 and FIG. 24, the nozzle plate 610 has a nozzle hole 612. The ink is ejected from the nozzle hole 612. A plurality of nozzles holes 612 are provided at the nozzle plate 610, for example. In the example shown in FIG. 24, the plurality of nozzle holes 612 is formed to be arranged in a single line. As the material of the nozzle plate 610, silicon, and stainless steel (SUS) may be exemplified, for example.

The flow path forming substrate 620 is provided on the nozzle plate 610 (below in the example in FIG. 24). As the material of the flow path forming substrate 620, for example, silicon may be exemplified. As a result of the flow path forming substrate 620 partitioning the space between nozzle plate 610 and the vibrating plate 1a, as shown in FIG. 24, a reservoir (liquid storage unit) 624, a supply port 626 communicating with the reservoir 624, and a pressure generating chamber 622 communicating with the supply port 626 are provided. In the example shown in FIG. 24, the reservoir 624, supply port 626, and the pressure generating chamber 622 are partitioned; however, any of these may be a flow path for a liquid (for example, may be a manifold) and it does not matter how these flow paths are designed. For example, the supply port 626 has a shape in which a part of the flow path is narrowed in the illustrated example; however, the supply port 626 may be arbitrarily formed according to the design and such a configuration is not necessarily required.

The reservoir 624 may temporarily store ink from an external part (for example, an ink cartridge) to be supplied through the through hole 628 provided in the vibration plate 1a. The ink in the reservoir 624 may be supplied to the pressure generating chamber 622 through the supply port 626. The pressure generating chamber 622 changes in volume according to deformation of the vibrating plate 1a. The pressure generation chamber 622 communicates with the nozzle hole 612 and ejects ink or the like from the nozzle hole 612 according to changes in the volume of the pressure generating chamber 622.

In addition, if the reservoir 624 and supply port 626 communicate with the pressure generating chamber 622, another member (not shown) may be provided with the flow path forming substrate 620.

The piezoelectric element 100 is provided on the flow path forming substrate 620 (below in the example of FIG. 24). The piezoelectric element 100 is electrically connected to a driving circuit (not shown) and may operate (vibrate, deform) based on the signal of the driving circuit. The vibrating plate 1a is deformed by the operation of the piezoelectric layer 20 and may appropriately change the internal pressure of the pressure generating chamber 622.

As shown in FIG. 24, the housing 630 may accommodate the nozzle plate 610, the flow path forming substrate 620, the vibrating plate 1a, and the piezoelectric element 100. As the material of the housing 630, for example, resin, metal, or the like may be exemplified.

The liquid ejecting head 600 has a piezoelectric element 100. Accordingly, the liquid ejecting head 600 may have high reliability.

Further, in the example above, description is given regarding a case where the liquid ejecting head 600 is an ink jet type recording head. However, the liquid ejecting head of the embodiment may be used as, for example, a color material ejecting head used in the manufacturing of color filters for liquid crystal display or the like, an organic EL display, an electrode material ejecting head used to form electrodes such as FED (field emission display), a bio-organic matter ejecting head used in the manufacturing of biochips, or the like.

6. Liquid Ejecting Apparatus

Figure 25:
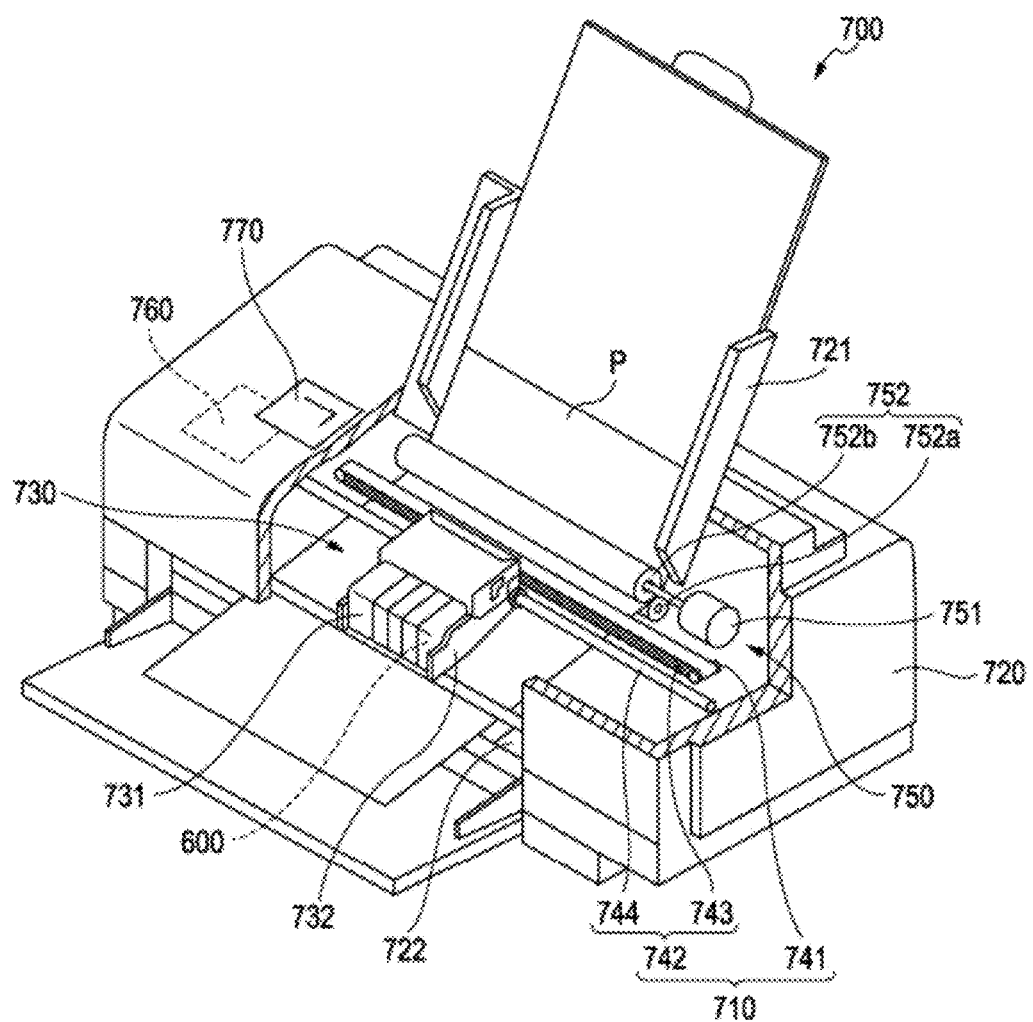
FIG. 25 is a perspective view schematically showing the liquid ejecting apparatus according to the present embodiment.

Next, the liquid ejecting apparatus according to the embodiment will be described with reference to the drawings. FIG. 25 is a perspective view schematically showing a liquid ejecting apparatus 700 according to the embodiment.

The liquid ejecting apparatus 700 has the liquid ejecting head according to the invention. Below, as the liquid ejecting head according to the invention, an example using the liquid ejecting head 600 will be described.

The liquid ejecting apparatus 700 includes, as shown in FIG. 25, the head unit 730, the driving unit 710, and the control unit 760. In addition, the liquid ejecting apparatus 700 may include an apparatus main body 720, a paper feeding unit 750, a tray 721 set up for recording paper P, a discharge outlet 722 for discharging the recording paper P, an operation panel 770 arranged on the upper surface of the apparatus main body 720.

The head unit 730 has an ink jet type recording head (below, simply referred to as "head") configured from the above-described liquid ejecting head 600. The head unit 730 is further provided with an ink cartridge 731 for supplying ink to the head, and a transport unit (carriage) 732 mounted with the head and ink cartridge 731.

The driving unit 710 may reciprocate the head unit 730. The driving unit 710 has a carriage motor 741 which becomes a driving source of the head unit 730, and a reciprocal movement mechanism 742 which receives the rotation of the carriage motor 741 and reciprocates the head unit 730.

The reciprocal movement mechanism 742 is provided with carriage guide shaft 744 in which both ends thereof are supported by a frame (not shown), and a timing belt 743 extending in parallel with the carriage guide shaft 744. The carriage guide shaft 744 supports the carriage 732 while allowing the carriage 732 to freely reciprocate. In addition, the carriage 732 is fixed to a part of the timing belt 743. According to the operation of the carriage motor 741, when the timing belt 743 is made to travel, the head unit 730 is guided by the carriage guide shaft 744 and reciprocates. At the time of the reciprocation, ink is appropriately ejected from the head and printing is performed on the recording paper P.

Further, in the embodiment, examples of a liquid ejecting apparatus in which printing is performed while moving one of the liquid ejecting head 600 and the recording paper P have been shown; however, it is sufficient if the liquid ejecting apparatus of the invention may be a mechanism in which the recording paper P is printed by changing the positions of the liquid ejecting head 600 and the recording paper P in relation to each other. Also, in the embodiment, examples in which printing is performed on a recording paper P have been shown; however, the recording medium on which printing may be performed by the liquid ejecting apparatus of the invention is not limited to paper but may be a wide range of media such as cloth, film, and metal, and the configuration may be changed appropriately.

The control unit 760 may control the head unit 730, the driving unit 710, and the paper feeding unit 750.

The paper feeding unit 750 can feed the recording paper P from the tray 721 to the head unit 730 side. The paper feeding unit 750 is provided with a paper feed motor 751 which becomes a driving source thereof, and a feeding roller 752 which rotates due to the operation of the paper feed motor 751. The paper feed roller 752 is provided with a driven roller 752a and a driving roller 752b facing each other in the vertical direction while interposing the feeding route of the recording paper P therebetween. The driving roller 752b is connected to the feeding motor 751. When the paper feeding unit 750 is driven by the control unit 760, the recording paper P is fed so as to pass through under the head unit 730. The head unit 730, the driving unit 710, the control unit 760 and the paper feeding unit 750 are provided inside the apparatus main body 720.

The liquid ejecting apparatus 700 has a liquid ejecting head 600. Accordingly, the liquid ejecting apparatus 700 may have high reliability.

Further, the above embodiments and modifications are examples, but the invention is not limited thereto. For example, it is also possible to combine each embodiment and each modification appropriately.

In the description above, the details of the embodiments of the invention have been described; however, those skilled in the art will readily understand that many modifications are possible without departing substantially from the new matters and effects of the invention. Accordingly, such modifications shall be included in this scope of the invention.

What is claimed is:

1. A piezoelectric element comprising:
   a first electrode;
   a piezoelectric layer formed above the first electrode to have a longitudinal direction and a transverse direction in a planar view, the piezoelectric layer having a side surface following the longitudinal direction; and
   a second electrode formed above the piezoelectric layer,
   wherein at least a part of the side surface of the piezoelectric layer includes a concavo-convex surface having a plurality of concavities and convexities in a cross-sectional view normal to the longitudinal direction, and
   a width of the piezoelectric layer in the transverse direction increases from the second electrode to the first electrode over the extent of the side surface,
   wherein the side surface of the piezoelectric layer has a flat surface connected to an upper surface of the piezoelectric layer,
   the concavo-convex surface is connected to the flat surface,
   the side surface of the flat surface and the second electrode is covered by a first coating layer,
   the concavo-convex surface is covered by a second coating layer, and
   Young's modulus of the second coating layer is smaller than Young's modulus of the first coating layer and Young's modulus of the piezoelectric layer.

2. The piezoelectric element according to claim 1, wherein the piezoelectric layer and the first electrode intersect with each other, and the side surface of the piezoelectric layer is a flat surface at another part where the piezoelectric layer intersects with the first electrode.

3. The piezoelectric element according to claim 1, wherein a width of the second electrode in the transverse direction is smaller than a minimum width of the piezoelectric layer in the transverse direction.

4. The piezoelectric element according to claim 1, wherein a side surface of the second electrode in the transverse direction is connected to the side surface of the piezoelectric layer in the cross-sectional view.

5. The piezoelectric element according to claim 1, wherein the side surface of the piezoelectric layer is covered by a coating layer, and Young's modulus of the coating layer is smaller than Young's modulus of the piezoelectric layer.

6. The piezoelectric element according to claim 1, wherein a material of the first coating layer is aluminum oxide and a material of the second coating layer is a polyimide.

7. A liquid ejecting head comprising the piezoelectric element according to claim 1.

8. A liquid ejecting apparatus comprising the liquid ejecting head according to claim 7.

* * * * *